(12) United States Patent
Benson et al.

(10) Patent No.: US 7,579,684 B2
(45) Date of Patent: Aug. 25, 2009

(54) METHODS FOR PACKING MICROFEATURE DEVICES AND MICROFEATURE DEVICES FORMED BY SUCH METHODS

(75) Inventors: Peter A. Benson, Boise, ID (US); Charles M. Watkins, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 370 days.

(21) Appl. No.: 11/430,483

(22) Filed: May 9, 2006

(65) Prior Publication Data

US 2006/0205116 A1  Sep. 14, 2006

Related U.S. Application Data

(62) Division of application No. 10/932,842, filed on Sep. 1, 2004, now Pat. No. 7,157,310.

(51) Int. Cl.
*H01L 23/12* (2006.01)
(52) U.S. Cl. .................. 257/701; 257/E23.021; 257/E23.125
(58) Field of Classification Search .......... 257/E23.001, 257/E23.002, E23.01, E23.02, E23.021, E23.023, 257/E23.116, E23.123, E23.125, E23.129, 257/E23.132
See application file for complete search history.

(56) References Cited

U.S. PATENT DOCUMENTS

| 5,218,234 A | 6/1993 | Thompson et al. |
| 5,593,927 A | 1/1997 | Farnworth et al. |
| 5,677,566 A | 10/1997 | King et al. |
| 5,696,033 A | 12/1997 | Kinsman |
| 5,739,585 A | 4/1998 | Akram et al. |
| D394,844 S | 6/1998 | Farnworth et al. |
| D402,638 S | 12/1998 | Farnworth et al. |
| 5,851,845 A | 12/1998 | Wood et al. |
| 5,866,953 A | 2/1999 | Akram et al. |
| 5,891,753 A | 4/1999 | Akram |
| 5,893,726 A | 4/1999 | Farnworth et al. |
| 5,898,224 A | 4/1999 | Akram |
| 5,933,713 A | 8/1999 | Farnworth |
| 5,938,956 A | 8/1999 | Hembree et al. |

(Continued)

OTHER PUBLICATIONS

Gilleo, Ken, "New Generation Underfills Power the 2nd Flip Chip Revolution," 8 pages, (undated), <http://www.cooksonsemi.com/tech_art/pdfs/New%20Generation%20Underfills.pdf>.

(Continued)

*Primary Examiner*—Charles D. Garber
*Assistant Examiner*—Reema Patel
(74) *Attorney, Agent, or Firm*—Perkins Coie LLP

(57) ABSTRACT

Methods for packaging microfeature devices on and/or in microfeature workpieces at the wafer level and microfeature devices that are formed using such methods are disclosed herein. In one embodiment, a method comprises providing a workpiece including a substrate having a plurality of microelectronic dies on and/or in the substrate. The individual dies include integrated circuitry and pads electrically coupled to the integrated circuitry. The method then includes depositing an underfill layer onto a front side of the substrate. The method also includes selectively forming apertures in the underfill layer to expose the pads at the front side of the substrate. The method further includes depositing a conductive material into the apertures and in electrical contact with the corresponding pads. In one aspect of this embodiment, the underfill layer is a photoimageable material.

17 Claims, 4 Drawing Sheets

U.S. PATENT DOCUMENTS

| | | | |
|---|---|---|---|
| 5,958,100 | A | 9/1999 | Farnworth et al. |
| 5,986,209 | A | 11/1999 | Tandy |
| 5,989,941 | A | 11/1999 | Wensel |
| 5,990,566 | A | 11/1999 | Farnworth et al. |
| 5,994,784 | A | 11/1999 | Ahmad |
| RE36,469 | E | 12/1999 | Wood et al. |
| 6,008,070 | A | 12/1999 | Farnworth |
| 6,008,074 | A | 12/1999 | Brand |
| 6,020,629 | A | 2/2000 | Farnworth et al. |
| 6,025,728 | A | 2/2000 | Hembree et al. |
| 6,028,365 | A | 2/2000 | Akram et al. |
| 6,046,496 | A | 4/2000 | Corisis et al. |
| 6,048,744 | A | 4/2000 | Corisis et al. |
| 6,048,755 | A | 4/2000 | Jiang et al. |
| 6,049,125 | A | 4/2000 | Brooks et al. |
| 6,072,236 | A | 6/2000 | Akram et al. |
| 6,075,288 | A | 6/2000 | Akram |
| 6,097,087 | A | 8/2000 | Farnworth et al. |
| 6,103,547 | A | 8/2000 | Corisis et al. |
| 6,107,122 | A | 8/2000 | Wood et al. |
| 6,107,680 | A | 8/2000 | Hodges |
| 6,117,382 | A | 9/2000 | Thummel |
| 6,124,634 | A | 9/2000 | Akram et al. |
| 6,150,717 | A | 11/2000 | Wood et al. |
| 6,159,764 | A | 12/2000 | Kinsman et al. |
| 6,172,419 | B1 | 1/2001 | Kinsman |
| 6,184,465 | B1 | 2/2001 | Corisis |
| 6,190,940 | B1 | 2/2001 | DeFelice et al. |
| 6,198,172 | B1 | 3/2001 | King et al. |
| 6,208,519 | B1 | 3/2001 | Jiang et al. |
| 6,210,992 | B1 | 4/2001 | Tandy et al. |
| 6,215,175 | B1 | 4/2001 | Kinsman |
| 6,228,548 | B1 | 5/2001 | King et al. |
| 6,228,678 | B1 | 5/2001 | Gilleo et al. |
| 6,229,202 | B1 | 5/2001 | Corisis |
| 6,246,108 | B1 | 6/2001 | Corisis et al. |
| 6,252,308 | B1 | 6/2001 | Akram et al. |
| 6,258,624 | B1 | 7/2001 | Corisis |
| 6,259,153 | B1 | 7/2001 | Corisis |
| 6,277,671 | B1 | 8/2001 | Tripard |
| 6,284,571 | B1 | 9/2001 | Corisis et al. |
| 6,291,894 | B1 | 9/2001 | Farnworth et al. |
| 6,294,839 | B1 | 9/2001 | Mess et al. |
| 6,303,981 | B1 | 10/2001 | Moden |
| 6,303,985 | B1 | 10/2001 | Larson et al. |
| 6,310,288 | B1 | 10/2001 | Moden |
| 6,310,390 | B1 | 10/2001 | Moden |
| 6,314,639 | B1 | 11/2001 | Corisis |
| 6,316,285 | B1 | 11/2001 | Jiang et al. |
| 6,326,242 | B1 | 12/2001 | Brooks et al. |
| 6,326,244 | B1 | 12/2001 | Brooks et al. |
| 6,326,687 | B1 | 12/2001 | Corisis |
| 6,326,697 | B1 | 12/2001 | Farnworth |
| 6,326,698 | B1 | 12/2001 | Akram |
| 6,329,220 | B1 | 12/2001 | Bolken et al. |
| 6,331,221 | B1 | 12/2001 | Cobbley |
| 6,331,453 | B1 | 12/2001 | Bolken et al. |
| 6,332,766 | B1 | 12/2001 | Thummel |
| 6,365,434 | B1 | 4/2002 | Rumsey et al. |
| 6,376,354 | B1 * | 4/2002 | Yih .......................... 438/613 |
| 6,387,795 | B1 | 5/2002 | Shao |
| 6,451,709 | B1 | 9/2002 | Hembree |
| 6,518,089 | B2 * | 2/2003 | Coyle ....................... 438/106 |
| 6,548,757 | B1 | 4/2003 | Russell et al. |
| 6,558,600 | B1 | 5/2003 | Williams et al. |
| 6,561,479 | B1 | 5/2003 | Eldridge |
| 6,564,979 | B2 | 5/2003 | Savaria |
| 6,576,494 | B1 | 6/2003 | Farnworth |
| 6,576,495 | B1 | 6/2003 | Jiang et al. |
| 6,589,820 | B1 | 7/2003 | Bolken |
| 6,614,092 | B2 | 9/2003 | Eldridge et al. |
| 6,622,380 | B1 | 9/2003 | Grigg |
| 6,638,595 | B2 | 10/2003 | Rumsey et al. |
| 6,644,949 | B2 | 11/2003 | Rumsey et al. |
| 6,653,173 | B2 | 11/2003 | Bolken |
| 6,661,104 | B2 | 12/2003 | Jiang et al. |
| 6,670,719 | B2 | 12/2003 | Eldridge et al. |
| 6,672,325 | B2 | 1/2004 | Eldridge |
| 6,673,649 | B1 | 1/2004 | Hiatt et al. |
| 6,924,171 | B2 | 8/2005 | Buchwalter et al. |
| 2006/0046346 | A1 | 3/2006 | Benson et al. |

OTHER PUBLICATIONS

Yala, Nadia, et al., "Overview of Wafer-Applied Underfill Activities: How to Turn Flip Chip's Drawbacks into Benefits," 21 pages, Chip Scale Review, Jan.-Feb. 2003, <http://www.chipscalereview.com/issues/0103/f5_01.php>.

* cited by examiner

METHODS FOR PACKING MICROFEATURE DEVICES AND MICROFEATURE DEVICES FORMED BY SUCH METHODS

CROSS-REFERENCE TO RELATED APPLICATION

This application is divisional of U.S. patent application Ser. No. 10/932,842, filed Sep. 1, 2004, which is incorporated herein by reference in its entirety.

TECHNICAL FIELD

The present invention relates to packaging microfeature devices and, in particular, methods for packaging such devices at the wafer level and microfeature devices formed by such methods.

BACKGROUND

Microelectronic device assemblies, such as memory chips and microprocessor chips, typically include one or more microelectronic components attached to a substrate and encased in a protecting covering. The microelectronic components commonly include at least one microelectronic die having functional features such as memory cells, processor circuits, and interconnecting circuitry. The dies also typically include bond-pads electrically coupled to the functional features. The bond-pads can be used to operatively connect the dies to external devices such as buses, circuits, and/or other microelectronic assemblies.

A plurality of microelectronic dies are generally formed simultaneously in a single microfeature workpiece or wafer. The dies typically have an active side with bond-pads that initially face upward. One step in the manufacturing process is the formation of conductive couplers (e.g., solder balls or pads of solder paste) on the bond-pads. For example, after forming the dies on the wafer, a highly accurate stenciling machine can deposit masses of solder paste onto the individual pads on the dies to form solder balls.

The stenciling machine generally includes a stencil and a wiper mechanism. In applications where the bond-pads on the dies have a very fine pitch, however, patterned layers of photoresists are typically used rather than stencils. In fine pitch applications, a resist is applied to the wafer and patterned to form a plurality of holes arranged in a pattern corresponding to the bond-pads on the dies. A wiper mechanism is then moved across the resist to drive the solder paste through the holes and into contact with the bond-pads on the wafer. The resist is then stripped away and the wafer is ready for further processing. One drawback associated with this method is that it includes a number of relatively expensive steps. For example, manufacturers must strip the resist and dispose of the chemical waste generated during removal of the resist. This can be quite expensive because there are many regulations for disposing of such chemical wastes. Another drawback with this method is that removing the resist may require chemical solvents that can attack (e.g., contaminate and/or damage) the various components of the dies and/or the wafer.

Another step in the packaging process is dicing or singulating the dies from the wafer and attaching the singulated dies to external devices. One type of microelectronic component, for example, is a "flip-chip" device. These components are referred to as "flip-chips" because after forming the solder balls on the bond-pads and singulating the dies, the individual dies are inverted or "flipped" such that the bond-pads face downward for attachment to terminals of a lead frame or interposer substrate. In applications using solder bumps, the solder bumps are reflowed to form a solder joint between the flip-chip component and the substrate. This leaves a small gap between the flip-chip and the substrate. To enhance the integrity of the joint between the microelectronic component and the substrate, an underfill material is introduced into the gap.

There are several drawbacks associated with this method of applying the underfill material. For example, the underfill material is typically dispensed into the gap by depositing a bead of the underfill material along one or two sides of the flip-chip when the underfill material is in a fluidic state (i.e., flowable) and allowing the underfill material to wick into the gap. After the underfill material fills the gap, it is cured to a hardened state. Although such a process yields good results, the processing time necessary to permit the underfill material to flow across the entire width of the die can reduce the throughput of the manufacturing process. Moreover, depositing and curing the underfill material necessitates further steps in the packaging process that can decrease throughput. Yet another drawback with this above process for depositing the underfill material is that one side of the flip-chip often has a greater concentration of underfill material. The nonuniform distribution of underfill material creates differences in the rigidity and the coefficient of thermal expansion across the die. Accordingly, new methods are needed for both forming stencils in fine pitch applications as well as applying underfill materials in flip-chip devices.

BRIEF DESCRIPTION OF THE DRAWINGS

FIG. 1A is a schematic side cross-sectional view of a microfeature workpiece including a plurality of microfeature devices after depositing a photoimageable underfill layer onto the workpiece.

FIG. 1B is a schematic side cross-sectional view of the microfeature workpiece undergoing a photolithographic process.

FIG. 1C is a schematic side cross-sectional view of the microfeature workpiece after developing the photoimagable underfill layer to form apertures in the underfill layer.

FIG. 1D is a schematic side cross-sectional view of the microfeature workpiece after depositing a conductive material into the apertures.

FIG. 1E is a schematic side cross-sectional view of a singulated microfeature device positioned for attachment to a support member.

FIG. 1F is a schematic side cross-sectional view of the microfeature device of FIG. 1E after attachment to the support member.

FIG. 2A is a schematic side cross-sectional view of a microfeature workpiece including a plurality of microfeature devices after depositing an underfill layer and a resist layer.

FIG. 2B is a schematic side cross-sectional view of the microfeature workpiece after forming a plurality of apertures in the underfill layer.

DETAILED DESCRIPTION

A. Overview

Figure 1A:
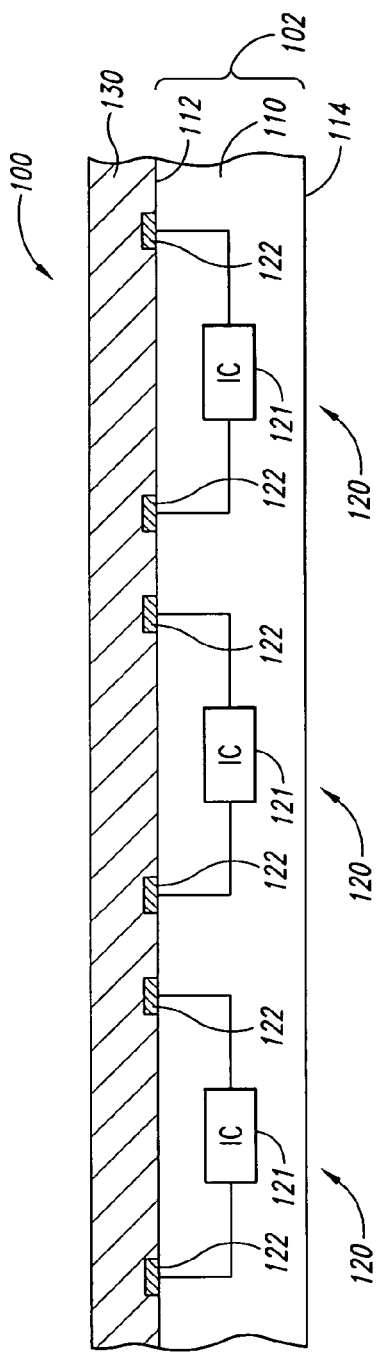
FIGS. 1A-1F illustrate various stages in one embodiment of a method for depositing an underfill layer onto a microfeature workpiece having a plurality of microfeature devices and attaching individual devices to a support member.

The following disclosure describes several embodiments of methods for packaging microfeature devices on and/or in microfeature workpieces at the wafer level and microfeature devices that are formed using such methods. The term "microfeature device" is used throughout to include microelectronic devices, micromechanical devices, data storage elements, read/write components, and other articles of manufacture. For example, microfeature devices include imagers, SIMM, DRAM, flash-memory,-ASICs, processors, flip chips, ball-grid array chips, and other types of electronic devices or components. The term "microfeature workpiece" is used throughout to include substrates in and/or on which microelectronic devices, micromechanical devices, data storage elements, and other features are fabricated. For example, microfeature workpieces can be semiconductor wafers, glass substrates, insulated substrates, or many other types of substrates. Several embodiments of the invention are shown in FIGS. 1A-2B. One skilled in the art will understand that the present invention may have other embodiments in addition to those disclosed below and that such other embodiments of the invention may be practiced with additional features or without several elements of the embodiments shown in FIGS. 1A-2B.

One aspect of the invention is directed toward methods for fabricating microfeature devices. An embodiment of one such method comprises providing a workpiece including a substrate having a plurality of microelectronic dies on and/or in the substrate. The individual dies include integrated circuitry and pads electrically coupled to the integrated circuitry. The method then includes depositing an underfill layer onto a front side of the substrate. The method also includes selectively forming apertures in the underfill layer to expose the pads at the front side of the substrate. The method further includes depositing a conductive material into the apertures and in electrical contact with the corresponding pads. In one aspect of this embodiment, the underfill layer is a photoimageable material.

Another aspect of the invention is directed toward a microfeature device assembly. One embodiment of such a microfeature device assembly comprises a substrate having a front side and a backside and a plurality of microelectronic dies on and/or in the substrate. The individual dies include integrated circuitry and pads at the front side of the substrate electrically coupled to the integrated circuitry. The workpiece includes an underfill layer covering the pads at the front side of the substrate. The workpiece also includes a plurality of selectively formed apertures extending through the underfill layer to corresponding pads at the front side of the substrate. The workpiece further includes a conductive material deposited into the apertures and in electrical contact with the corresponding pads.

B. Methods of Packaging of Microfeature Devices

FIGS. 1A-1F illustrate various stages in one embodiment of a method for depositing an underfill material onto a microfeature workpiece having a plurality of microfeature devices and attaching a singulated device to a support member. In the illustrated method, an underfill material is deposited onto a plurality of microfeature devices as part of a batch process at the wafer level before cutting the workpiece. In other embodiments, however, the underfill material can be dispensed onto a single microfeature device according to the illustrated method.

FIG. 1A is a schematic side cross-sectional view of an assembly 100 fabricated in accordance with one embodiment of the invention. The assembly 100 can include a microfeature workpiece 102 having a substrate 110 with a front side 112 and a backside 114. The workpiece 102 can also include a plurality of microelectronic dies 120 in and/or on the substrate 110. Each microelectronic die 120 can include integrated circuitry 121 and a plurality of pads 122 electrically coupled to the integrated circuitry 121. In the illustrated embodiment, the pads 122 are bond-pads 122 at the front side 112 of the substrate 110. In other embodiments, however, the pads 122 can include other types of electrical connectors and/or be positioned at other locations on the dies 120.

The assembly 100 further includes an underfill layer 130 deposited onto the front side 112 of the substrate 110. The underfill layer 130 can be deposited onto the substrate 110 using spin-on techniques, spraying techniques, molding, vapor deposition processes (e.g., chemical vapor deposition or physical vapor deposition), and/or other processes known to those of skill in the art. In the illustrated embodiment, the underfill layer 130 is composed of a photoimageable material. More specifically, the underfill layer 130 can be composed of a photoimageable silicone. Photoimageable silicones have some properties of photoimageable polyimides, and some properties of underfills. An example of a photoimageable silicone material is WL-5350, commercially available from Dow Corning.

Figure 1B:
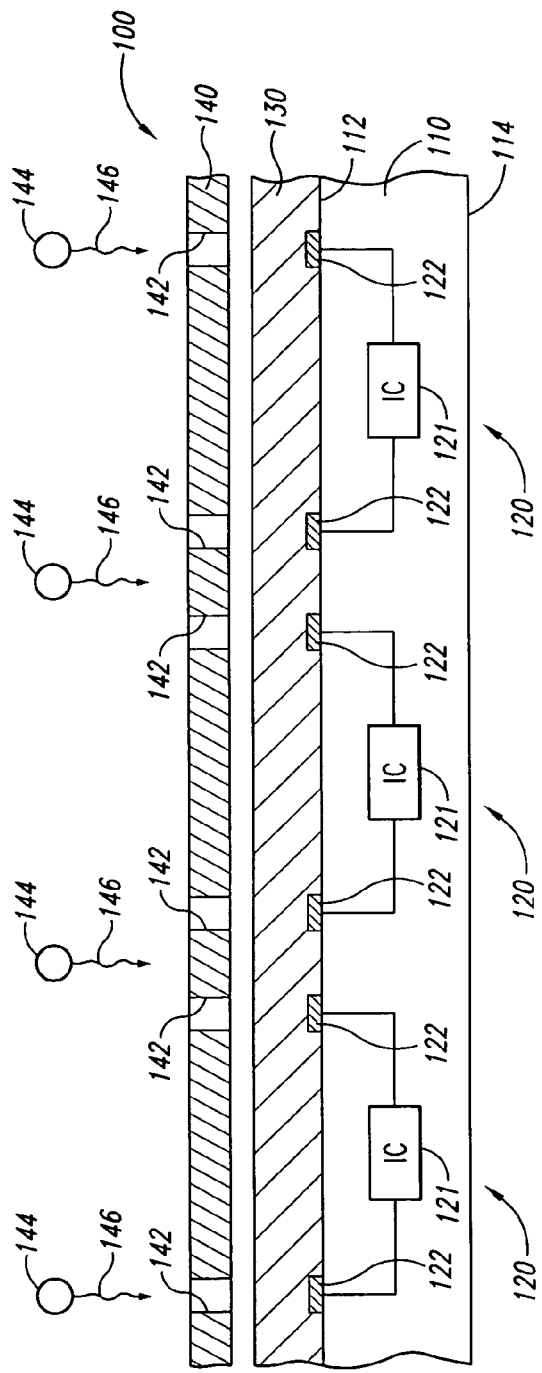

A plurality of apertures or openings are then formed in the underfill layer 130. Referring to FIG. 1B, for example, a reticle or mask 140 is positioned over the underfill layer 130. The mask 140 includes a plurality of apertures 142 corresponding to a desired pattern of apertures for the underfill layer 130, and the mask 140 is aligned with the substrate 110 to position the apertures 142 relative to the pads 122. This procedure is accordingly directed to a positive photoimageable underfill layer 130. After aligning the mask 140 with the underfill layer 130, a photolithographic procedure is used to selectively expose portions of the underfill layer 130. More specifically, radiation sources 144 project radiation 146 through the apertures 142 in the mask 140 and onto selected portions of the photoimageable underfill layer 130. In an alternative embodiment for a negative photoimageable underfill material, the mask has apertures corresponding to the areas of underfill material between the pads 122.

Figure 1C:
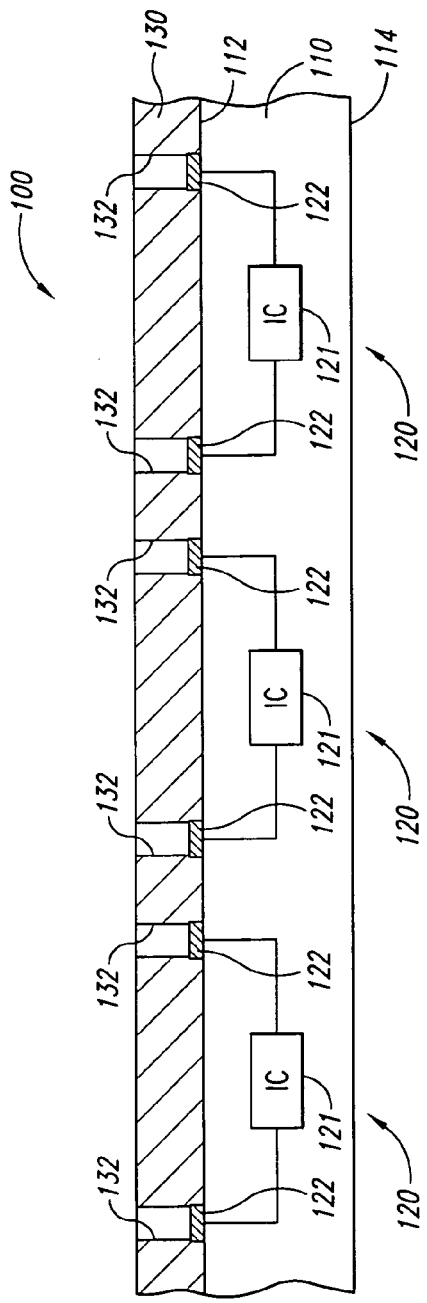

Referring to FIG. 1C, the exposed portions of the underfill layer 130 over the pads 122 are developed to form a plurality of apertures 132 in the underfill layer 130. The apertures 132 in the illustrated embodiment extend through the underfill layer 130 to the corresponding pads 122 at the front side 112 of the substrate 110. In alternative embodiments, the apertures 132 can be formed using an etching process and/or another process known to those of skill in the art. In another alternative embodiment for a negative underfill, the portions of the underfill layer 130 between the pads 122 are exposed to a radiation such that the unexposed portion of the underfill layer 130 can be removed.

Figure 1D:
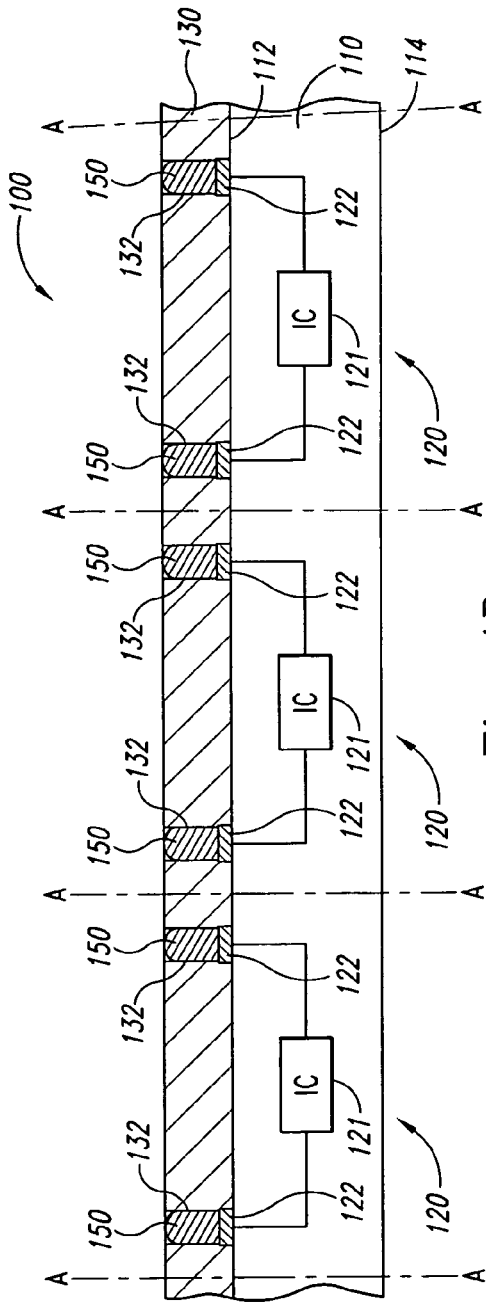

The method continues by filling the individual apertures 132 with a conductive material 150. Referring to FIG. 1D, for example, the conductive material 150 can be a solder paste, conductive epoxy, solder, conductive polymers or other conductive material that is deposited into the apertures 132 in the underfill layer 130. A solder paste can be deposited into the apertures 132 using a wiper assembly (not shown) that presses the solder paste into the apertures 132. In alternative embodiments, other processes can be used to deposit the conductive material 150 into the apertures 132. The conductive material 150, for example, can be deposited into the apertures 132 using an electroplating process, placing a preformed sphere of metal fill in the apertures 132 and melting the sphere, injecting a flowable material into the apertures 132, passing the assembly 100 across a solder wave, and/or other suitable methods known to those of skill in the art. In several embodiments, the conductive material 150 can be reflowed at this point in the process, but this is optional. More specifically, a heat source can heat the solder paste to vaporize the flux and melt the solder. After depositing the conductive material 150 into the apertures 132, the workpiece 102 is cut along lines A-A to singulate the individual dies 120.

Figure 1E:
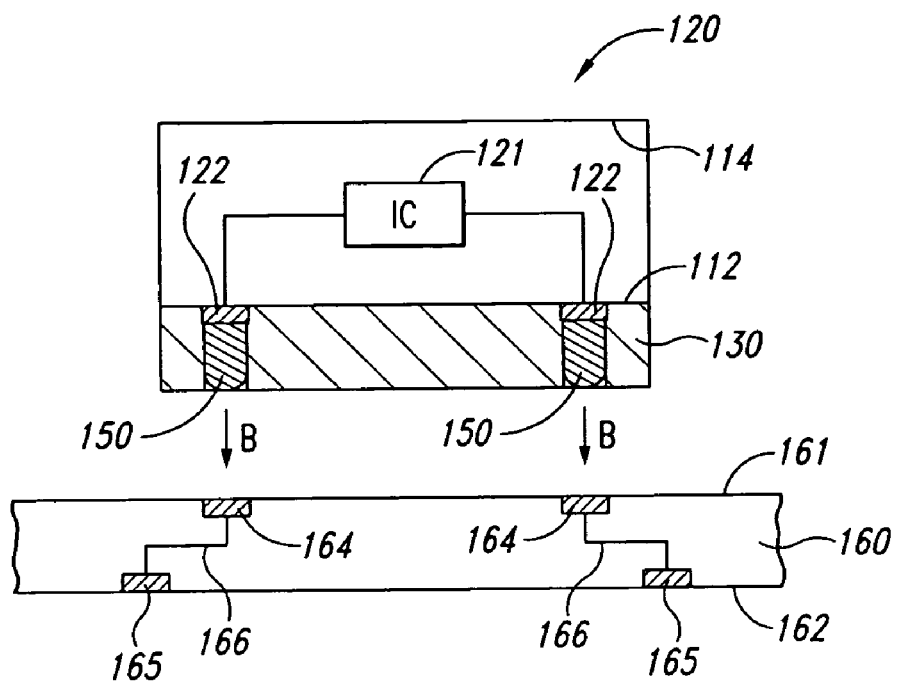

Referring next to FIG. 1E, a singulated die 120 can be attached to a support member 160, such as flex tape, a circuit board, or another suitable member, to redistribute electrical signals from the integrated circuitry 121 of the die 120 to an external device. In the illustrated embodiment, the support member 160 includes a first side 161 having a plurality of first contact pads 164 and a second side 162 having a plurality of second contact pads 165. A plurality of traces 166 extend through the support member 160 to electrically couple the first contact pads 164 to corresponding second contact pads 165. To attach the die 120 to the support member 160, the die 120 is "flipped" (i.e., inverted) such that the pads 122 at the front side 114 of the die 120 are aligned with corresponding first contact pads 164 at the first side 161 of the support member 160 (as shown by arrows B).

Figure 1F:
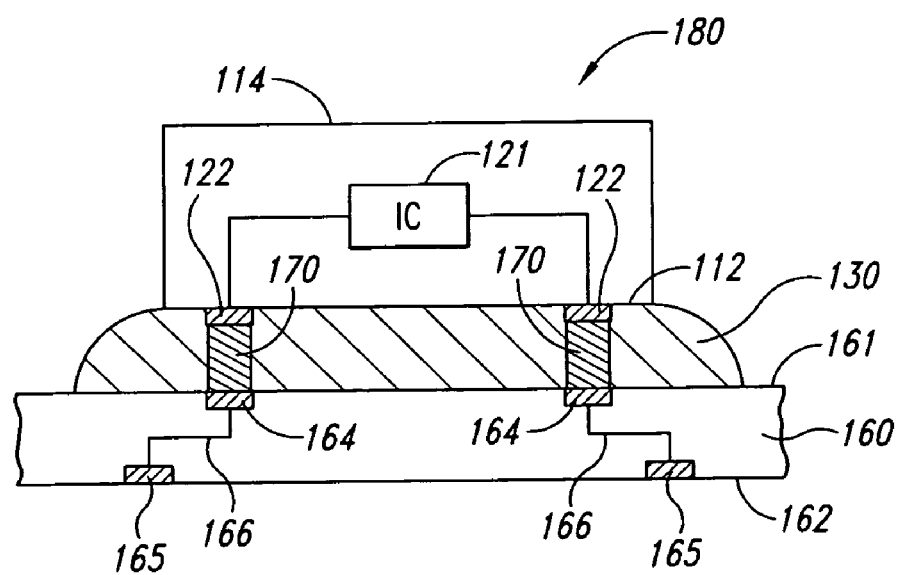

FIG. 1F is a side cross-sectional view of a microfeature device 180 including the singulated die 120 attached to the support member 160 such that the underfill material 130 is between the die 120 and the support member 160. The die 120 is also aligned with the support member 160 so that the pads 122 at the front side 112 of the die 120 are electrically coupled to the first contact pads 164 at the first side 161 of the support member 160 by interconnects 170 formed from the conductive material 150. To attach the die 120 to the support member 160, the microfeature device 180 can undergo a single heat/pressure procedure to (a) reflow the conductive material 150 and form the interconnects 170 within the apertures 132, and (b) cure the underfill layer 130. The temperature of this procedure depends, in part, on the temperature required to reflow the conductive material 150 and the temperature the underfill layer 130 can withstand. As shown in FIG. 1F, the heat/pressure procedure causes the underfill layer 130 to flow outside of the perimeter of the die 120. The underfill layer 130 accordingly bears some of the stress placed on the components of the device 180 and protects the various components from moisture, chemicals, and other contaminants.

Several embodiments of the methods illustrated above in FIGS. 1A-1F are expected to reduce the costs and increase throughput compared to using a sacrificial resist layer to form the apertures over the bond-pads. The conventional processes described above require a separate resist layer to be deposited onto the workpiece and a subsequent step to apply a separate underfill material into the gaps between the flip-chip component and the support member. In the method described above, however, the photoimageable underfill layer 130 acts as both a stencil for the conductive material and an underfill material. The processes set forth with respect to FIGS. 1A-1F accordingly eliminate the material costs of a sacrificial resist and reduce the costs for disposing of waste products to remove a sacrificial resistive layer. These processes also eliminate (a) the time to flow a separate underfill material between the die and the substrate, and (b) the problems associated with a non-uniform distribution of underfill material. Accordingly, several embodiments of the fabrication processes set forth above with respect to FIGS. 1A-1F are expected to be faster, more efficient, and less expensive than conventional processes.

Figure 2A:
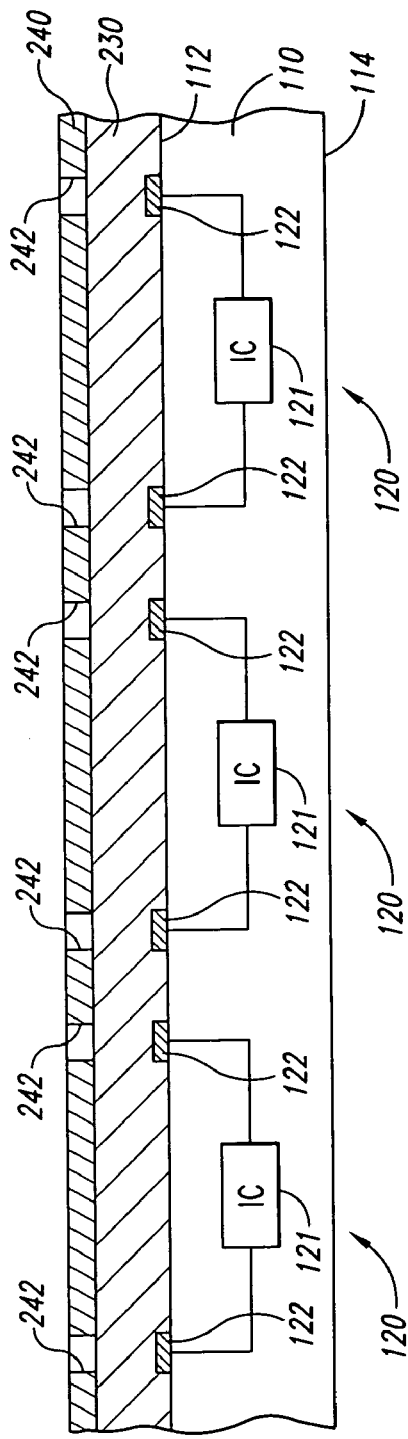
FIGS. 2A and 2B illustrate stages in a method of depositing an underfill material onto a microfeature workpiece in accordance with another embodiment of the invention.
Figure 2B:
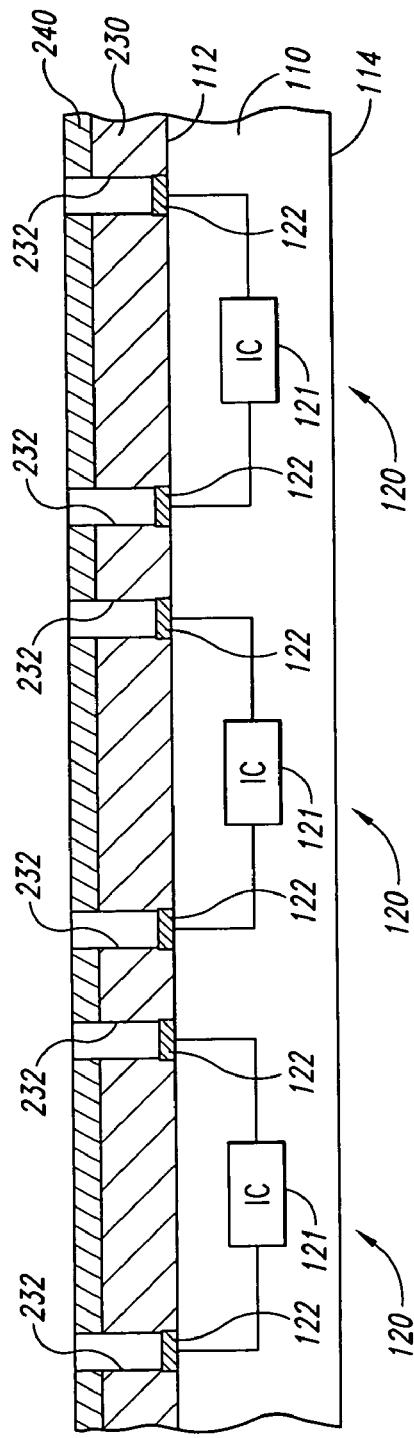

FIGS. 2A and 2B illustrate stages of a method for forming an underfill layer on a workpiece in accordance with another embodiment of the invention. Referring to FIG. 2A, an underfill layer 230 can be deposited onto the front side 112 of the substrate 110. The underfill layer 230 shown in FIG. 2A differs from the underfill 130 described above in that the underfill layer 230 is not a photoimageable material. Suitable materials for the underfill layer 230 can include the CSP-1412, X14221, CN-1432, and/or CN-1453 underfills from Zymet, Inc. Accordingly, a separate resist layer 240 is deposited onto the underfill layer 230 and then patterned to have apertures 242. The resist layer 240 can be patterned using a photolithographic process similar to that described above with respect to FIG. 1B.

Referring to FIG. 2B, the underfill layer 230 is etched to form apertures 232 extending through the underfill layer 230 to the corresponding pads 122 at the front side 112 of the substrate 110. The underfill layer 230 can be etched using a suitable etching process, such as an anisotropic etch. In alternative embodiments, the apertures 232 can be formed in the underfill layer 230 using a laser and/or mechanical machining process. In the case of using a laser or mechanical machining process, a layer of photoresist is not required. The resist layer 240 can then be removed from the underfill layer 230, after which the workpiece can undergo the procedures as described above with respect to FIGS. 1D-1F to form interconnects in the apertures 232 and attach individual dies 120 to a substrate.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A microfeature device assembly, comprising:
   a microfeature workpiece including a substrate having a front side and a backside;
   a plurality of microelectronic dies on and/or in the substrate, the individual dies including integrated circuitry and pads at the front side of the substrate electrically coupled to the integrated circuitry;
   an underfill layer covering the pads at the front side of the substrate, wherein the underfill layer comprises a photoimageable material;
   a plurality of selectively formed apertures extending through the underfill layer to corresponding pads at the front side of the substrate; and
   a conductive material deposited into the apertures and in electrical contact with the corresponding pads.

2. The assembly of claim 1 wherein the conductive material comprises solder paste.

3. The assembly of claim 1 wherein the plurality of apertures are selectively formed using a photolithographic process without the use of a separate resist layer.

4. The assembly of claim 1, further comprising a resist layer deposited onto the underfill layer, the resist layer including a plurality of apertures arranged in a pattern corresponding to the desired pattern of apertures through the underfill layer, and wherein the resist layer is removed after the plurality of apertures are selectively formed.

5. The assembly of claim 1 wherein the photoimageable material comprises a photosilicone material.

6. A microfeature device assembly, comprising:
   a microfeature workpiece including a substrate having a front side and a backside;
   a plurality of microelectronic dies on and/or in the substrate, the individual dies including integrated circuitry and pads at the front side of the substrate electrically coupled to the integrated circuitry;
   a underfill layer on the front side of the substrate and covering the pads, the underfill layer having a plurality of apertures aligned with and open to corresponding pads at the front side of the substrate, and wherein the underfill layer comprises a photoimageable material;

a solder paste deposited into the apertures and in electrical contact with the corresponding pads.

7. The assembly of claim 6 wherein the photoimageable material comprises a photosilicone material.

8. The assembly of claim 6 wherein:

the plurality of apertures are formed by exposing selected portions of the underfill layer to a selected radiation that alters a property of the underfill layer without the use of a sacrificial resist layer.

9. The device of claim 6 wherein the underfill layer on the front side of the substrate is configured to function as both a stencil for the solder paste and an underfill material.

10. A microfeature device, comprising:

a microelectronic die having a front side, a backside, integrated circuitry, and a plurality of bond-pads at the front side electrically coupled to the integrated circuitry an underfill layer on front side of the die, the underfill layer including a plurality of apertures extending through the underfill layer to the bond-pads and conductive material deposited into the apertures and in electrical contact with the bond-pads, and wherein the underfill layer comprises a photoimageable material;

a support member having a plurality of contact pads electrically coupled to corresponding bond-pads, wherein the underfill layer is between the die and the support member and the conductive material in the apertures electrically couples the bond-pads to corresponding contact pads on the support member.

11. The device of claim 10 wherein the support member comprises a first side with a plurality of first contact pads, a second side opposite the first side and having a plurality of second contact pads, and a plurality of traces extending through the support member electrically coupling the first contact pads to corresponding second contact pads.

12. The device of claim 10 wherein:

the support member comprises a first side with a plurality of first contact pads and a second side opposite the first side, the second side having a plurality of second contact pads; and the front side of the die is facing the first side of the support member and the backside of the die is facing away from the first side of the support member, and wherein the bond-pads are electrically coupled to corresponding first contact pads.

13. The device of claim 10 wherein the conductive material comprises solder paste, conductive epoxy, solder, and/or a conductive polymer material.

14. The device of claim 10 wherein the underfill layer is configured to function as both a stencil for the conductive material and an underfill material.

15. The device of claim 10 wherein the underfill layer comprises a photoimageable material, and wherein the plurality of apertures are selectively formed through the underfill layer using a photolithographic process without the use of a sacrificial resist layer.

16. The device of claim 10 wherein at least a portion of the underfill layer between the die and the support member is disposed outboard of a perimeter of the die.

17. The assembly of claim 10 wherein the conductive material comprises conductive epoxy, solder, and/or a conductive polymer material.

* * * * *

UNITED STATES PATENT AND TRADEMARK OFFICE
CERTIFICATE OF CORRECTION

PATENT NO.         : 7,579,684 B2
APPLICATION NO.    : 11/430483
DATED              : August 25, 2009
INVENTOR(S)        : Peter A. Benson et al.

It is certified that error appears in the above-identified patent and that said Letters Patent is hereby corrected as shown below:

On the face page, in field (54), in "Title", in column 1, line 1, delete "PACKING" and insert -- PACKAGING --, therefor.

In column 1, line 1, delete "PACKING" and insert -- PACKAGING --, therefor.

In column 7, line 18, in Claim 10, delete "circuitry" and insert -- circuitry; --, therefor.

Signed and Sealed this

Twenty-sixth Day of January, 2010

David J. Kappos
*Director of the United States Patent and Trademark Office*